(12) United States Patent
Chen et al.

(10) Patent No.: US 12,313,963 B2
(45) Date of Patent: May 27, 2025

(54) MICRO-DISPLAY OPTICAL ENGINE AND PROJECTOR

(71) Applicant: Changsha Pujiade Photoelectric Technology Co., Ltd, Hunan (CN)

(72) Inventors: Ling Chen, Hunan (CN); Rao Chen, Hunan (CN); Yating Pan, Hunan (CN); Jie Wang, Hunan (CN)

(73) Assignee: Changsha Pujiade Photoelectric Technology Co., Ltd, Changsha (CN)

( * ) Notice: Subject to any disclaimer, the term of this patent is extended or adjusted under 35 U.S.C. 154(b) by 274 days.

(21) Appl. No.: 18/091,246

(22) Filed: Dec. 29, 2022

(65) Prior Publication Data

US 2024/0103349 A1 Mar. 28, 2024

(30) Foreign Application Priority Data

Sep. 27, 2022 (CN) .......................... 202211178691.5

(51) Int. Cl.
*G03B 21/14* (2006.01)
*G03B 21/16* (2006.01)
*G03B 33/12* (2006.01)
*H01L 25/075* (2006.01)

(52) U.S. Cl.
CPC ........... *G03B 21/142* (2013.01); *G03B 21/16* (2013.01); *G03B 33/12* (2013.01); *H01L 25/0753* (2013.01)

(58) Field of Classification Search
CPC ...... G03B 21/142; G03B 21/16; G03B 33/12; H01L 25/0753
USPC ........................................... 353/31
See application file for complete search history.

(56) References Cited

U.S. PATENT DOCUMENTS

2020/0241399 A1* 7/2020 Wei ...................... H04N 9/3138

\* cited by examiner

*Primary Examiner* — Jerry L Brooks

(57) ABSTRACT

The present disclose discloses a micro-display optical engine including a micro-LED panel, a coolant, a thin lens, a metal frame, a connecting pillar and a projection lens; the micro-LED panel comprises a substrate, a number of pixel light-emitting micro-LED grains, a glass plate, a metal bracket, a sealing frame, a radiator, a filling adhesive and a transparent heat-conducting adhesive. The present disclose also discloses a single-engine, dual-engine and three-engine full-color projector. The present disclose has remarkable features such as relatively simple production, the ability to achieve preliminary productization, excellent thermal stability of heat dissipation, high contrast and color gamut, laying a certain foundation for the actual productization of the new micro-LED micro-display projection technology.

7 Claims, 5 Drawing Sheets

MICRO-DISPLAY OPTICAL ENGINE AND PROJECTOR

CROSS-REFERENCE TO RELATED APPLICATION

This application claims priority from the Chinese patent application 202211178691.5 filed Sep. 27, 2022, the content of which is incorporated herein in the entirety by reference.

TECHNICAL FIELD

The present disclosure relates to the field of projector, and more particularly to a micro-display optical engine and projector for optical amplification display of micro-display devices.

BACKGROUND

Micro-LED is most anticipated among the new generation of display technology, which has the dual function of illumination or pixel emitting light, in some specific products such as LCD TV with mini/micro-LED as a backlight, in VR (virtual reality), AR, etc. (augmented reality), MR (mixed reality) and other wearable areas with micro-LED as a pixel light-emitting device, it has gradually shown a strong, more comprehensive technical superiority. In the practical application of the projection display industry, many patent technology prototypes and imaginative technology exploration have emerged one after another, such as Chinese Patent Publication No. CN110687742A, CN113242415A, CN110687741A, CN216718895U, CN109976079A, etc., although many patents are still considered to be insufficiently innovative or have been withdrawn, it shows that micro-LED technology has attracted widespread attention from the society.

In terms of micro-LED display panel at present, when applied to traditional projection industries such as achieving full-color display, greater than 1000 lumens, same-frame contrast ratio being greater than 50:1 and other basic elements, it still has a long distance to productization. In addition that micro-LED manufacturing technology such as substrate stripping, pad bonding (or Bonding), mass transfer (Mass transfer), high-power active driver and other factors are not mature, but also reflecting that the larger power panel (because projection needs the highest possible brightness) is relatively scarce, the thermal stability of the higher power panel is still difficult to effectively deal with, there are also a series of difficulties such as panel light and color consistency, but this does not affect people's enthusiasm for research and development and the expectation for the new generation of micro-display technology.

The existing prototype micro-LED projection display technology, its direction of research and development is still in the groping stage, including but not limited to using panels with color light or using panels with three-base color, and performing RGB light combination, and whether manufacturing the one-to-one corresponding micro-lens matrix in front of the light-emitting pixels and other specific technical methods, it has not yet appeared more reasonable views and unified direction of effort, this is essentially due to the lack of a practical implementation approach. This is not only a manufacturing problem faced by the micro-LED panel industry itself at this stage, but also includes the problem of upstream and downstream communication barriers in the supply chain brought by reversing the technical requirements of micro-LED panels based on the definition of projector performance, as well as the trade-off of projector cost performance, projector optics, thermal design and other realistic problems that the projection industry needs to face, these extensive and practical problems make the technical challenges of implementing productization to research and develop micro-LED projection products very significant. As long as people implement specific technical breakthroughs one by one, it will be of positive help and significant significance to the mass production of micro-LED projection products in the future.

Referring to the disclosure of "IHS Markit Micro-LED display technology and market report", which was named by famous analysis institution in the industry, IHS Markit, predicted the production and sales of micro-LED panel will mature in 2024 and blowout, that is, representing that the above-mentioned technology tends to mature, the cost is significantly reduced and the production capacity is released enormously, so the research and development of micro-LED projection products with real value, have been no time to wait.

SUMMARY

The purpose of the present disclosure is to advance and solve some specific technical problems that need to be faced in the productization of micro-LED projection display, so that it can take a step forward to the direction of landing productization for micro-LED projection display. The present disclosure provides a new micro-display optical engine based on the use of micro-LED pixels to emit light and perform projection amplification, the present disclosure has the significant features of relatively simple production, the ability to achieve preliminary productization, excellent thermal stability of heat dissipation, and a higher contrast and color gamut, etc., laying a certain foundation for the actual productization of the new micro-LED micro-display projection technology.

To achieve the above purpose, the present disclosure provides a micro-display optical engine comprising a micro-LED panel, a coolant, a thin lens, a metal frame, a connecting pillar and a projection lens.

The micro-LED panel comprises a substrate, a number of pixel light-emitting micro-LED grains, a glass plate, a metal bracket, a sealing frame, a radiator, a filling adhesive and a transparent heat-conducting adhesive.

The sealing frame is in the shape of a square tube, the sectional length and width dimensions of the sealing frame are equal to the length and width dimensions of the glass plate; the incident surfaces of the substrate, the sealing frame and the glass plate are fitted sequentially; located among the substrate, sealing frame and glass plate, a number of the micro-LED grains are set on the substrate, and the drive circuit for addressing a number of the micro-LED grains one by one; the electrodes of a number of the micro-LED grains are bonded to the drive circuit set on the substrate; the electrodes of a number of the micro-LED grains are inverted structures.

The length of the sealing frame is 6 μm-10 μm greater than the height value of the top surface of a number of the micro-LED grains above the surface of the substrate.

The luminous colors of a number of the micro-LED grains are single-base color, dual-base color or three-base color.

The metal frame is in the shape of a tube, and one end of the metal frame and the outgoing surface of the glass plate are fitted, and the other end is connected with the thin lens to form a closed cavity; the closed cavity is filled with the coolant; the glass plate, the coolant and the thin lens form a liquid lens.

The metal bracket covers outside the substrate, sealing frame, glass plate and one end of the metal frame, and the substrate is fitted to be installed on the inner surface of the metal bracket; the metal frame, the glass plate and the metal bracket are filled with the filling adhesive; the radiator is fitted to be installed on the back of the metal bracket.

The outgoing surface of the glass plate is made into a first black matrix in the area outside the light-emitting angle θ selected by a number of the micro-LED grains.

The incident surface of the glass plate is made into a second black matrix in the area outside the light-emitting angle θ selected by a number of the micro-LED grains.

The incident surface of the glass plate is made with the transparent heat-conducting adhesive in the area opposite to a number of the micro-LED grains, and the top surface of a number of the micro-LED grains, the transparent heat-conducting adhesive and the incident surface of the glass plate are fitted sequentially; the thickness of the transparent heat-conducting adhesive is 10 μm.

The projection lens comprises an outer lens barrel, and an incident lens set, an intermediate lens set and an outgoing lens set installed inside the outer lens barrel and set successively according to the direction of light traveling; the incident lens set, the intermediate lens set and the outgoing lens set all contain at least one lens; the metal bracket is connected with the outer lens barrel through the connecting pillar; the number of the connecting pillar is at least greater than or equal to three.

After the combination of the liquid lens and the projection lens, the Fno≤1.2.

Preferably, the material of the glass plate is an optical crystal.

Optionally, the incident lens set comprises a first lens and a second lens arranged successively according to the direction of light traveling; the number of lenses of the intermediate lens set is one piece; the outgoing lens set comprises a fourth lens and a fifth lens arranged successively according to the direction of light traveling.

Preferably, the thin lens is concave-convex, the convex surface is opposite to the glass plate; the convex and concave surfaces of the thin lens are one of free-form surface, aspheric surface or spherical surface or a combination of any two.

The thickness of the thin lens is equal or unequal from the center to the edge.

The light-passing surface of the concave surface of the thin lens has a shape: when a number of the micro-LED grains emit light at an angle, which is greater than that the Fno value limits on the angle of light, greater than that the light limited the angle by the Fno value is fully reflected on the concave surface.

Optionally, the absolute value of the refractive index difference between the coolant and the thin lens≤0.2; the absolute value of the refractive index difference between the coolant and the glass plate≤0.3.

Optionally, the filling adhesive is silicone rubber.

Optionally, the transparent heat-conducting adhesive is optical grade silicone.

A single-engine full-color projector comprises the micro-display optical engine, the number of the micro-display optical engine is one, the luminous color of a number of micro-LED grains comprised in the micro-display optical engine is three-base color.

A dual-engine full-color projector comprises the micro-display optical engine, the number of the micro-display optical engines is two, when the luminous color of a number of micro-LED grains comprised in the first micro-display optical engine is single-base color, the luminous color of a number of micro-LED grains comprised in the second micro-display optical engine is dual-base color, and the two-base color of the second micro-display optical engine, excludes the color emitted by the first micro-display optical engine; the two micro-display optical engines are set at an angle a or side by side, wherein the angle a≤14°.

When the two micro-display optical engines are set side by side, the two micro-display optical engines are set off-axis from each other; the off-axis distance of the first micro-display optical engine toward the second micro-display optical engine is d, and the off-axis distance of the second micro-display optical engine toward the first micro-display optical engine is e; let the optical axis of the first micro-LED panel comprised in the first micro-display optical engine be L51, the optical axis of the second micro-LED panel comprised in the second micro-display optical engine be L55, the distance between the optical axis L51 and the optical axis L55 be c, and the projection magnification of the two micro-display optical engines be β, then c=β(d+e).

A three-engine full-color projector comprises the micro-display optical engine, the number of the micro-display optical engine is three, the luminous color of a number of micro-LED grains comprised in each of the micro-display optical engines is one of three-base color.

The first micro-display optical engine and the middle micro-display optical engine are set at angle b/2, and the third micro-display optical engine and the middle micro-display optical engine are set at angle b/2, wherein the angle b≤28°.

Or three micro-display optical engines are set side by side, and the two micro-display optical engines distributed on both sides: the off-axis distance of the first micro-display optical engine toward the middle micro-display optical engine is g, and the off-axis distance of the third micro-display optical engine toward the middle micro-display optical engine is k; let the optical axis of the first micro-LED panel comprised in the first micro-display optical engine be L61, the optical axis of the second micro-LED panel comprised in the middle micro-display optical engine be L62, the distance between the optical axis L61 and the optical axis L62 be f, and the projection magnification of the two micro-display optical engines be β, then f=βg; let the optical axis of the third micro-LED panel comprised in the third micro-display optical engine be L63, and the distance between optical axis L63 and optical axis L62 be j, and the projection magnification of the two micro-display optical engines be β, then j=βk.

The beneficial effects of the present disclosure are as follows:

1. The original intention of the present disclosure is to make small Fno lens (Fno≤1.2), the micro-LED grains are effectively dissipated heat and formed liquid lens by the coolant, the transparent heat-conducting adhesive and glass plate, etc., liquid lens can significantly reduce the influence of stray light on the contrast of the projected image because that the projection lens Fno is too small. Meanwhile, the present disclosure is also designed to ensure that the micro-display optical engine has higher contrast and less stray light as much as possible by making black matrices on the incident surface and the outgoing surfaces of the glass plate. These innovative means make the micro-LED micro-display projection technology take a solid step forward. The present disclosure has remarkable features such as relatively simple fabrication, the ability to achieve preliminary (not too high resolution under the current realistic condition, etc.) productization, and excellent thermal stability of heat dissipation.

2. The single-engine full-color projector of the present disclosure has very simple structural features that enable preliminary productization and experience the significant advantages of high color gamut, high contrast ratio and high efficiency brought by the advanced micro-LED micro-display technology.

3. The dual-engine and three-engine full-color projector of the present disclosure, in addition to having a simple structure, can improve the brightness of micro-LED applying to projection products under current technical condition, as well as significantly reduce the difficulty of manufacturing micro-LED panels.

BRIEF DESCRIPTION OF THE DRAWINGS

In order to explain the embodiments of the present disclosure or the technical solution in the prior art more clearly, the following briefly introduces the drawings that need to be used in the description of the embodiments or the prior art, obviously, the drawings in the following description are only some embodiments of the present disclosure, for the ordinary technician in the art, other drawings can also be obtained according to these drawings without creative efforts.

DETAILED DESCRIPTION OF SAMPLE EMBODIMENTS

Figure 1:
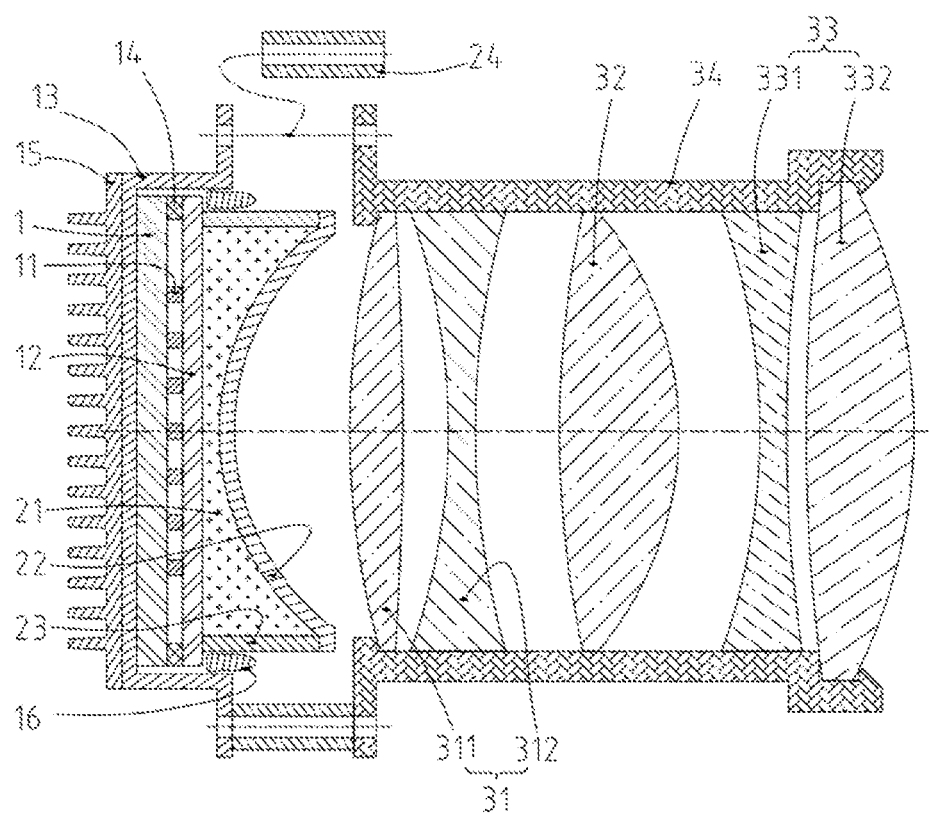
FIG. 1 is a schematic diagram of an embodiment of the present disclosure.

In order to make the technician skilled in the art better understand the technical solutions of the present disclosure, the present disclosure will be described in detail below with reference to the drawings, the description in this part is only exemplary and explanatory, and should not have any limiting effect on the protection scope of the present disclosure.

It should be noted that similar reference numerals and letters refer to similar items in the following drawings, so once an item is defined in one drawing, it does not require further definition and explanation in subsequent drawings.

It should be noted that the orientation or positional relationship indicated by the terms of "center", "upper", "lower", "left", "right", "vertical", "horizontal", "inner", "outer", etc., indicate the orientation or positional relationship based on the orientation or positional relationship shown in the drawings, or the orientation or positional relationship that the product of the disclosure is usually placed in use, it is only for the convenience of describing the present disclosure and simplifying the description, rather than indicating or implying that the indicated device or element must have a specific orientation, be constructed and operate in a specific orientation, therefore should not be construed as a limitation of the present disclosure. Furthermore, the terms of "first", "second", "third", etc., are only used to differentiate the description and should not be construed as indicating or implying relative importance.

Furthermore, the terms of "horizontal", "vertical", "overhanging" etc., do not imply that a component is required to be absolutely horizontal or overhanging, but can be slightly inclined. For example, "horizontal" only means that its direction is more horizontal than "vertical", it does not mean that the structure must be completely horizontal, but can be slightly inclined.

In the description of the present disclosure, it should also be noted that, unless otherwise expressly specified and limited, the terms of "set", "install", "connect" and "interface" should be understood in a broad sense, for example, it may be a fixed connection, it can also be a detachable connection, or an integral connection; it can be a mechanical connection or an electrical connection; it can be a direct connection, or an indirect connection through an intermediate medium, or the internal communication between the two components. For the ordinary technician in the art, the specific meanings of the above-mentioned terms in the present disclosure can be understood in specific situations.

Although there are certain technical challenges to realize full-color micro-LED so far, one is limited by the process and technology of material growth, that is, it is still difficult to grow efficient R (red), G (green), and B (blue) micro-LED grains ("wafer particles", "chip particles", "luminous (sub) pixels", etc., similarly hereinafter) simultaneously on the same substrate material, so people change the way by huge transfer of R, G, B micro-LED grains to the same structural substrate (the substrate is silicon-based or glass-based at this stage), or the use of short-wave (e.g., UV or blue light) micro-LED grains to excite long-wave phosphor or quantum dot material to realize RGB full-color display and other schemes. These schemes have achieved certain implementation results and are in continuous development and maturity, such as pixel light-emitting micro-LED children's watches and other wearable products have achieved preliminary mass production, laying a preliminary foundation for the productization of micro-LED projection, and creating the condition for the successful implementation in practice of the present disclosure.

Each micro-LED grain emits light (or Lambertian reflector) as a cosine function, so the projection lens needs a very large numerical aperture, that is, a very small Fno (aperture) value, in order to use the light efficiently and project it out. However, a lens with a large numerical aperture is bound to have a low contrast ratio, so how to ensure that the projected image has a high contrast ratio, which is a fundamental condition for the usefulness of the product.

Figure 8:
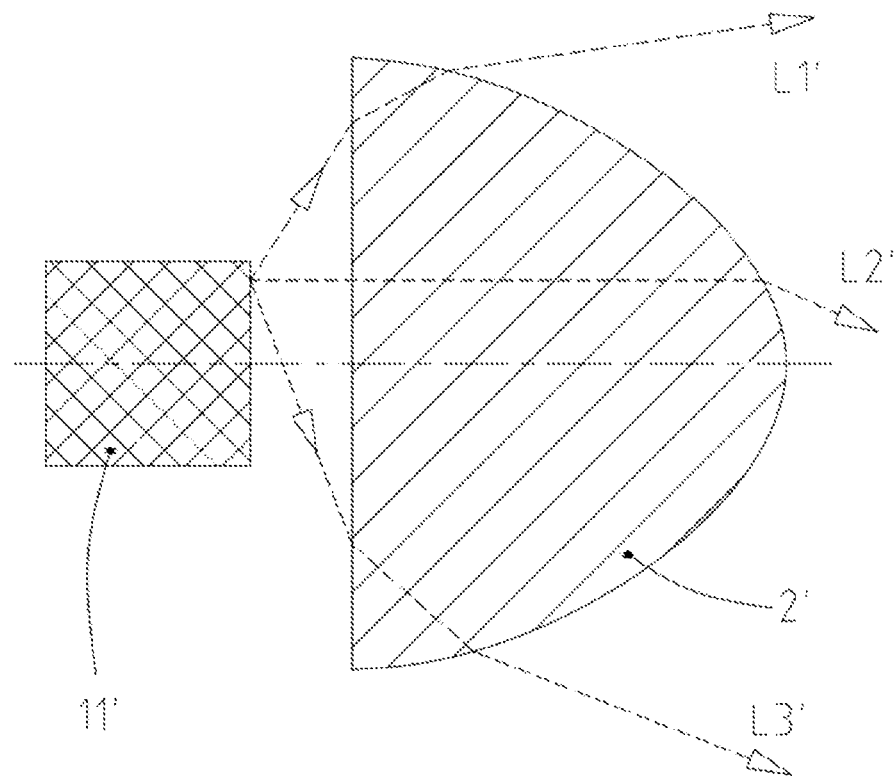
FIG. 8 is a schematic diagram of the micro-LED grains and micro-lens.
Figure 9:
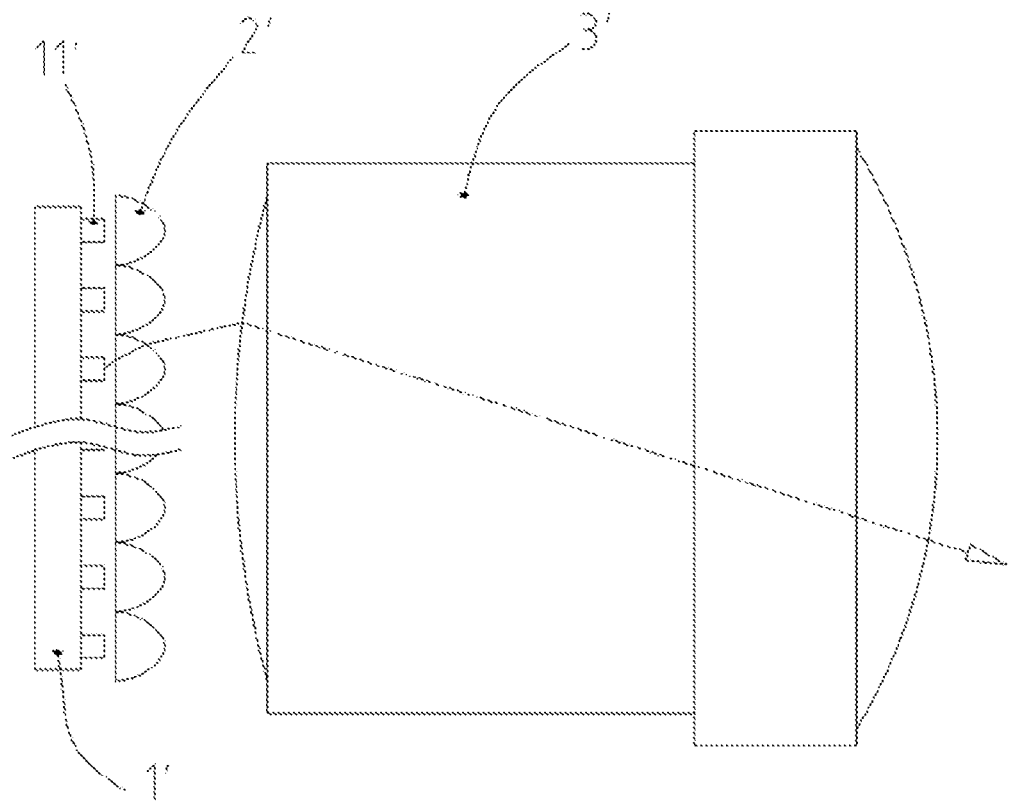
FIG. 9 is a schematic diagram of the prior art.

People use lenses (micro-lens arrays) and other means to improve the efficiency of direct-view micro-LED grains emitting light (or extracting light), and have obtained some effects. So people think that using lenses and other ways to reduce the light-emitting angle of the micro-LED grains, and then reduce design and production difficulties of the projection lens, or make the projection lens exist easier (or cheaper) implementation possibilities in theory, and produce some prototype patent technology, such as Chinese Patent Publication No. CN109716174A, CN114846364A, CN112802403A, CN112802404A, etc., all are trying to change the light-emitting angle of the micro-LED grains, that is, the light-emitting of the micro-LED grains is shaped according to the required index. Referring to FIG. 8-9, a number of pixel light-emitting micro-LED grains 11' are manufactured on the substrate 1', and each of the micro-LED grains 11' corresponds to a concentrating micro-lens 2', accordingly, a number of the micro-lenses 2' form a microlens array, which can significantly increase the Fno value of the projection lens 3' in theory. Referring to FIG. 8, any three rays L1', L2' and L3' are emitted from the micro-LED grains 11', and the angle of the rays L1'-L3' has been refracted (so-called light shaping in the industry) as they enter and exit the micro-lens 2'.

Figure 10:
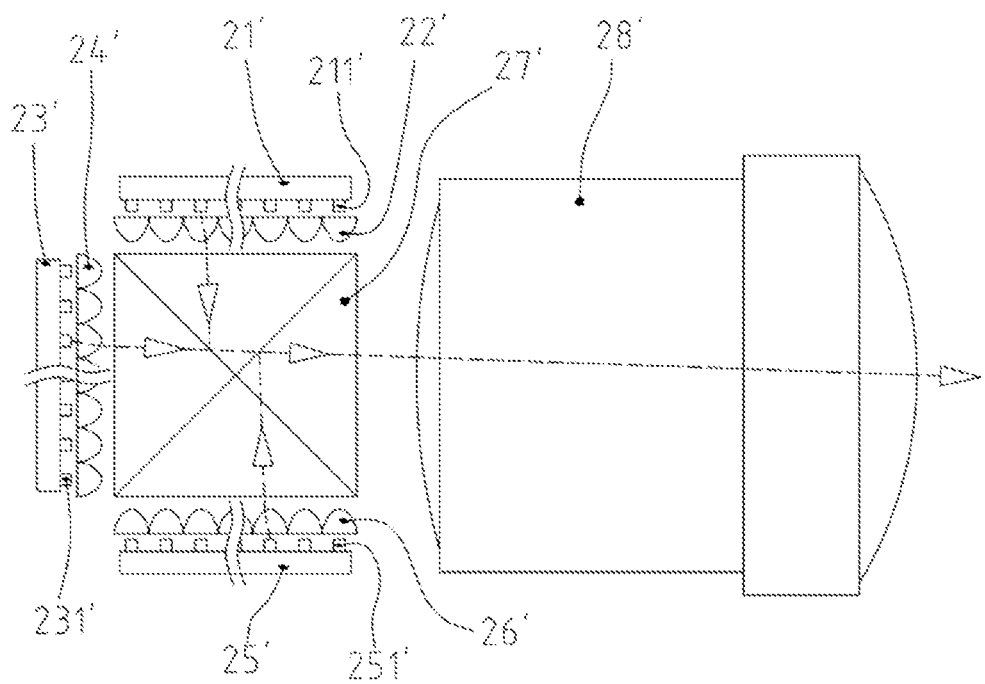
FIG. 10 is a schematic diagram of the prior art.

In turn, the optical system of the R, G, and B three-piece micro-LED light-emitting pixel panels is also made as in the same way. Referring to FIG. 10, a number of red micro-LED grains 211' are manufactured on R substrate 21', each grain 211' corresponds to a micro-lens 22'; a number of green micro-LED grains 231' are manufactured on substrate G 23', each grain 231' corresponds to a micro-lens 24'; and a number of blue micro-LED grains 251' are manufactured on substrate B 25', each grain 251' corresponds to a micro-lens 26'. The light is then combined by the prism X 27' and projected out through the projection lens 28'. The technology shown in FIG. 10 is not only designed to increase the Fno value of the projection lens 28', but also to accommodate the very demanding aperture function of the prism X 27' (or other light-combining devices based on dichroic optical film technology) in the first place.

Obviously, referring to FIG. 9, the above-mentioned technology hopes that a single lens such as micro-lens 2' will significantly compress the light-emitting angle of Lambert reflector light-emitting micro-LED grains such as grain 11', for example, from a single side 90° (Fno about 0.5) to a single side 12° (Fno about 2.4), is totally impractical. At the same time, micro-lens array composed of a number of micro-lenses, needs to realize one-to-one correspondence (coaxial optics) with the optical center of a number of micro-LED grains, this beautiful idea is uncertain, especially after re-solidification by the huge transfer, it is almost impossible to realize. Then, the single lens compresses and shapes the light-emitting angle of the micro-LED grains, compressing and shaping effect depends on the ratio of the light-passing area of the single lens to the top luminous area of the micro-LED grains, which is subject to the size of the micro-LED grain, the spacing of the grain and a number of engineering conditions. If the ratio of the light-passing area of the single lens to the top luminous area of the micro-LED grains is close to 1, the single lens can not change the light-emitting angle of the micro-LED grains (unless the efficiency of light extraction is significantly sacrificed), that is, the compressing and shaping effect tends to be close to zero. If we blindly research and development for these uncertain goals, the final research and development result is imaginable.

Compared with various existing prototype patent technologies whose implementation may be uncertain, the present disclosure, with the initial intention of making a small Fno lens (Fno≤1.2), completes the heat dissipation of micro-LED grains 11 and the formation of a liquid lens by the coolant 21, transparent heat-conducting adhesive 17 and glass plate 12, and ensures a proper solution to the impact of stray light on the contrast of the projected image because the Fno of the projection lens is too small, this makes that the micro-LED micro-display projection technology has taken a solid step forward.

Embodiment 1

Figure 2:
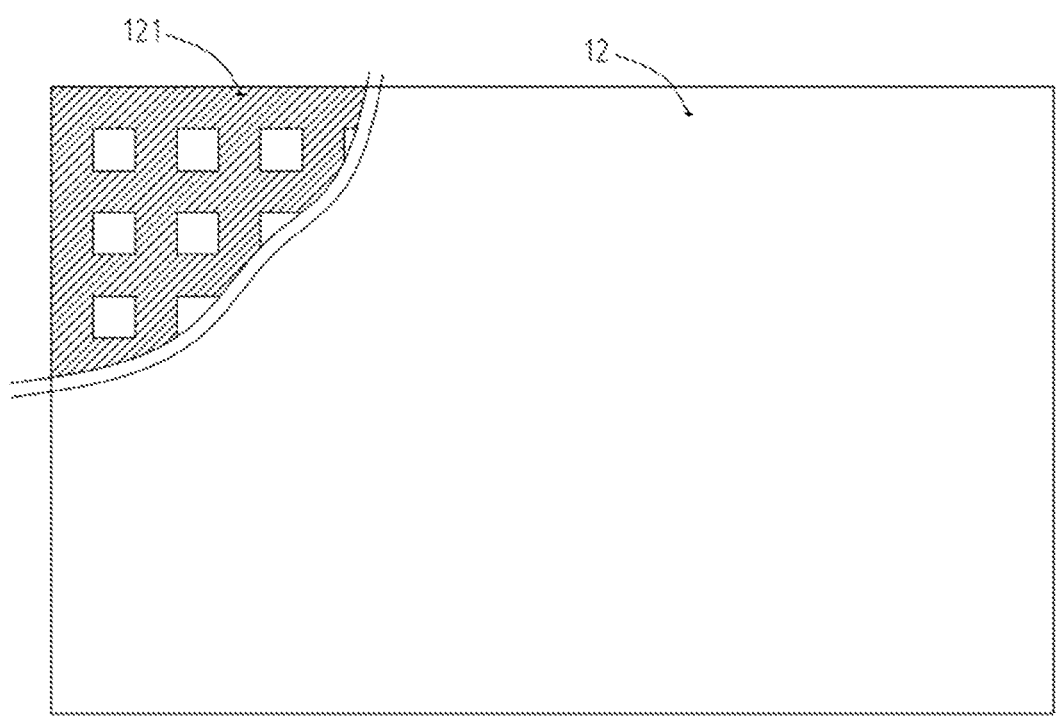
FIG. 2 is the arrangement schematic diagram of the glass plate black matrix of the present disclosure.
Figure 3:
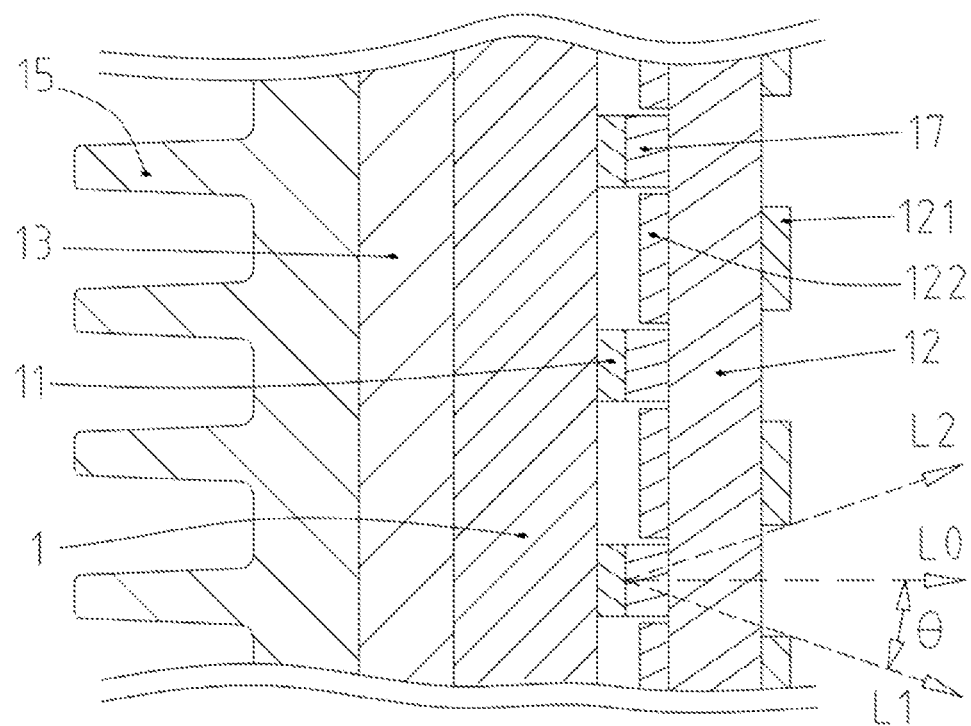
FIG. 3 is a local amplification schematic diagram of the present disclosure.

Referring to FIG. 1-3, this embodiment provides a microdisplay optical engine comprising a micro-LED panel, a coolant 21, a thin lens 22, a metal frame 23, a connecting pillar 24, and a projection lens.

The micro-LED panel comprises a substrate 1, a number of pixel light-emitting micro-LED grains 11, a glass plate 12, a metal bracket 13, a sealing frame 14, a radiator 15, a filling adhesive 16 and a transparent heat-conducting adhesive 17. As far as current technology is concerned, the consistency of color (tolerance range <2 nm for each basic color of wavelength) cannot yet be too demanding, but there are already certain solutions for correction to the consistency of brightness.

The sealing frame 14 is in the shape of a square tube, the sectional length and width dimensions of the sealing frame 14 are equal to the length and width dimensions of the glass plate 12. Preferably (but not limited to) the sealing frame 14 is made of the same material as the glass plate 12. Preferably (but not limited to) the substrate 1, the glass plate 12 and the sealing frame 14 are made of sapphire glass to obtain excellent thermal conductivity and exclude the risk of failure due to thermal expansion and contraction. The incident surfaces of the substrate 1, sealing frame 14 and glass plate 12 are sequentially fitted to each other; located among the substrate 1, sealing frame 14 and glass plate 12, a number of the micro-LED grains 11 are set on the substrate 1, and a drive circuit for addressing a number of the micro-LED grains 11 one by one (low temperature polycrystalline silicon TFT active drive circuit manufactured on substrate 1), these technologies are very mature in China, such as BOE and Huaxing, and outside China, such as AU Optronics and Samsung, and so on, not drawn on the figures, not to repeat); the electrodes of a number of the micro-LED grains 11 are bonded to the drive circuit set on the substrate 1, the electrodes of a number of the micro-LED grains 11 are inverted structures (not drawn on the figures).

The length of the sealing frame 14 (meaning to the length of the square tube) is 6 μm-10 μm greater than the height of the top surface of a number of the micro-LED grains 11 above the surface of the substrate 1. The top surface of the micro-LED grains 11 is uneven after the huge transferring to the receiving substrate (substrate 1) and bonding, because on one hand, the thickness of the micro-LED grains 11 itself has a certain tolerance range, and on the other hand, the height difference is also generated during bonding, so the selection of the length of the sealing frame 14 is very important, otherwise the heat dissipation effect of the glass plate 12 and transparent heat-conducting adhesive 17 on a number of the micro-LED grains 11 will be significantly discounted.

The luminous color of a number of the micro-LED grains is single, dual or three-base colors. Micro-LED panels are made in ascending order of difficulty from single, dual to three-base color. The three-base color, that is, full-color display realizes RGB full-color display by making micro-LED grains 11 of R, G and B on the same substrate 1 as mentioned above, or by using micro-LED grains 11 of short wavelength (e.g. UV or blue light) to excite long wavelength of phosphor or quantum dot material. Under the current technical conditions, the wavelength excitation technology still has many problems.

The metal frame 23 is in the shape of a tube, and one end of the metal frame 23 and the glass plate 12 is fitted to the outgoing surface, and the other end is connected to the thin lens 22 to form a closed cavity; the closed cavity is filled with the coolant 21; the glass plate 12, the coolant 21 and the thin lens 22 form a liquid lens. Preferably, the inner wall of the metal frame 23 is made in black to facilitate the absorption of stray light, and the outer wall may be made with the necessary heat expansion structure as appropriate to lose heat for the coolant 21.

The metal bracket 13 covers outside one end of the substrate 1, sealing frame 14, glass plate 12 and metal frame 23, and the substrate 1 is fitted to be set on the inner surface of the metal bracket 13; the metal frame 23, the glass plate 12 and the metal bracket 13 are filled with the filling adhesive 16, the filling adhesive serves to further strengthen and differentiate the force of the metal frame 23, the substrate 1 and the glass plate 12 and other materials, that is, to concentrate the force of the micro-LED panel on top of the metal bracket 13 as far as possible; the radiator 15 is fitted to be set on the back of the metal bracket 13. The radiator 15 is preferable, but not limited to, a straight rib profile radiator.

Referring to FIG. 2 and FIG. 3, the outgoing surface of the glass plate 12 is in the area outside the light-emitting angle θ selected by a number of the micro-LED grains 11 (the area outside the light rays L1, L2 in FIG. 3), which is made into a first black matrix 121; the light-emitting angle θ is a specific value, using the angle corresponding to the Fno as a reference design value, but it does not imply that the value of the light-emitting angle θ is equal to the limiting value of the Fno (arcsin (0.5/Fno)). The light-emitting angle θ of the micro-LED grains 11>the angle corresponding to the Fno (arcsin (0.5/Fno)), whose light cannot be used by the optical engine, so it is blocked as much as possible to reduce stray light. When the Fno=1.2, the light ray about >24.6° can no longer be used. However, the micro-LED grains 11 are not absolute point light sources, so the selection of the specific value of θ is often an empirical reflection of the design, the light-emitting angle of the micro-LED grains 11>the light ray of θ, which is completely blocked by the first black matrix 121 as much as possible to ensure the contrast of the projected image. The specific size of the first black matrix 121 is mainly related to the size of the micro-LED grains 11, the thickness of the transparent heat-conducting adhesive 17, the selection of θ and the thickness of the glass plate 12.

The process of manufacturing the first black matrix 121 is very mature, similar to the process of manufacturing the BM (Black Matrix, that is, black matrix, black frame, etc.) of LCD, and the level of BM process is more than enough to apply to the production of the first black matrix 121 described in the disclosure, because the BM line width is very mature and stable under the current technical condition, while the micro-LED panels for projection, as of now, do not need such a fine (≤3 μm) structure. Meanwhile, considering the mutual non-interference of the first black matrix 121 (organic material+toner) and the coolant 21, the production of a transparent protective film on the surface of the first black matrix 121 is a matter of common sense, all won't be repeated.

Accordingly, the incident surface of the glass plate 12 is made into a second black matrix 122 in the area outside the light-emitting angle θ selected by a number of the micro-LED grains 11. The specific size of the second black matrix 122 at this point is mainly related to the size of the micro-LED grains 11, the value of θ, and the thickness of the transparent heat-conducting adhesive 17.

The setting of the first black matrix 121 and second black matrix 122 is also helpful to further enhance the depth of field of the projection lens.

The incident surface of the glass plate 12 is made with the transparent heat-conducting adhesive 17 in the area opposite to a number of the micro-LED grains 11, and the top surface of a number of the micro-LED grains 11, the transparent heat-conducting adhesive 17 and the incident surface of the glass plate 12 are sequentially fitted; the thickness of the transparent heat-conducting adhesive 17 is 10 μm; preferably, the transparent heat-conducting adhesive 17 is optical grade silicone to obtain better thermal conductivity, sufficient light resistance and excellent interfacial filling elasticity, and better transmittance. The process of manufacturing the transparent heat-conducting adhesive 17 is similar to the process of manufacturing the first black matrix 121 and the second black matrix 122.

The projection lens comprises an outer lens barrel 34, and an incident lens set 31, an intermediate lens set 32 and an outgoing lens set 33 installed inside the outer lens barrel 34 and set successively according to the direction of light traveling; the incident lens set 31, the intermediate lens set 32 and the outgoing lens set 33 all contain at least one lens; the metal bracket 13 is connected to the outer lens barrel 34 by the connecting pillar 24; the number of the connecting pillars 24 is at least greater than or equal to three.

After the combination of the liquid lens and the projection lens, the Fno≤1.2. In this embodiment, the micro-LED panel is selected (but not limited to) about 2.6 inch panel (improved from the latest full-color micro-LED panel process for smart watches) as the pixel light source of the present disclosure, with a resolution of 480*RGB*272, and each (set of) light-emitting pixels comprises three direct light-emitting sub-pixel grains R, G, and B, and the three sub-pixels are arranged in (but not limited to) a "pin" shape; the size of each light-emitting sub-pixel is about 12 μm*12 μm; to ensure the smooth production of the substrate 1, the center distance of each set of light-emitting pixel is 0.12 mm. The spatial frequency MTF of the projection lens described in this embodiment takes the value of 5 Lp/mm, and the designing target value of the whole area can be easily >65%, and when Fno=1.2, the depth of field, aberration and distortion and other indicators are superior; the number of lenses of the incident lens set 31 of the projection lens is two, the first lens 311 (positive lens) and the second lens 312 (negative lens) are set successively according to the direction of light traveling, the incident lens set 31 assumes the main chromatic aberration correction; the number of lenses of the intermediate lens set 32 is one, contributing the main magnification; the number of lenses of the outgoing lens set 33 is two, the fourth lens 331 (negative lens) and the fifth lens 332 (positive lens) are set successively according to the direction of light traveling. The substrate 1 is a series of processes such as thin film deposition, photoresist coating, exposure, development, etching and photoresist stripping on sapphire glass to form the drive circuit of the micro-LED grains 11 and the electrodes bonded to the micro-LED grains 11, certainly comprising contact pads (pads) of other peripheral circuit, as well as high current inflow and outflow wiring structure, etc., all won't be repeated.

The thin lens 22 is preferable to (but not limited to) concave-convex type, the convex surface is opposite to the glass plate 12; the convex and concave surfaces of the thin lens 22 are one or a combination of any two of free-form, aspheric or spherical surfaces. In this embodiment, both the convex and concave surfaces of the thin lens 22 are free-form with unequal thicknesses from the center to the edge, but with relatively very, very small offset values, which essentially close to equal thicknesses to ensure the best accuracy for injection molding.

The light-passing surface of the concave surface of the thin lens 22 has a shape: when a number of the micro-LED grains 11 emit light at an angle, which is greater than that the Fno value limits on the angle of light, greater than that the light limited the angle by the Fno value is fully reflected on the concave surface. Here it should be particularly noted that, as mentioned above, the micro-LED grains 11 are not absolute point light sources, the light-emitting angle greater than the corresponding angle of the value of the Fno, in practice, not all can be said to absolutely perform total reflection, which is also a matter of engineering experience on reasonable selection of the main light and off-axis light, all won't be repeated.

The absolute value of the difference between the refractive indexes of the coolant 21 and the thin lens 22≤0.2; the absolute value of the difference between the refractive indexes of the coolant 21 and the glass plate 12≤0.3. Selecting a suitable refractive index match can effectively reduce the Fresnel reflection of all interfaces, improve light transmission efficiency and reduce stray light.

As the drive circuit of the micro-LED panel is LTPS TFT technology, after being projected and enlarged to 100 inches, under the current grain screening, drive circuit and other technical conditions, there are still a series of process defects such as splash screen, mosaic, bright and dark lines, uneven bright color. The total power consumption of the drive of this embodiment is close to 100 W, about 0.61 mW per set of pixels, wherein about 0.15 mW for R sub-pixel, about 0.24 mW for G sub-pixel, about 0.22 mW for B sub-pixel, and the remaining about 20 W electrical power is consumed by the drive circuit, the micro-display optical engine can output about >800 lumens of luminous flux, with the same frame (ANSI, American Standards Institute), that is, the contrast ratio of eight white/eight black is up to 600:1, the color gamut is up to 95% (NTSC), and the contrast ratio of the sequential field (all white/all black) is close to infinity, these are excellent figures, compared with domestic LCD or DLP projectors, many indicators such as contrast ratio, color gamut, hierarchy, trailing, ghosting, and high-speed motion images such as displaying stopwatch characters jumping are much better, while the temperature rise of each grain, especially the temperature rise of the grains located in the central area of the micro-LED panel, can be controlled in the range of <3° C.-4° C. compared to the radiator 15 and the coolant 21, and the disclosure has a better heat dissipation under the condition of about >70 W power of Joule heat and 2.6 inch of area. With the progress of technology, the brightness and resolution can be continuously improved, and the shortcomings such as splash screen, mosaic, bright and dark lines, and uneven bright color will surely be properly solved.

Embodiment 2

This embodiment provides a single-engine full-color projector comprising the micro-display optical engine described in embodiment 1, the number of the micro-display optical engines is one, and the luminous color of a number of micro-LED grains 11 comprised in the micro-display optical engine is three-base color.

The single-engine projector of this embodiment has very simple structural features that can realize initial productization and experience the significant advantages of high color gamut, high contrast ratio and high efficiency from advanced micro-LED micro-display technology.

Embodiment 3

Figure 4:
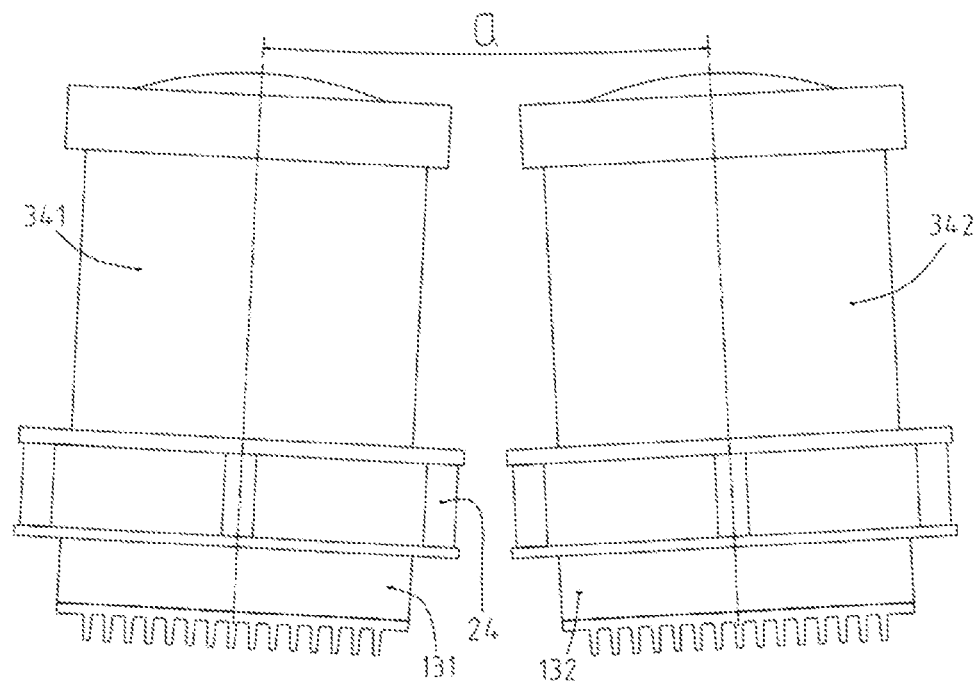
FIG. 4 is a schematic diagram of two micro-display optical engines set at angle a of the present disclosure.

Referring to FIG. 4, this embodiment provides a dual-engine full-color projector, which comprises the micro-display optical engine described in embodiment 1, the number of the micro-display optical engines is two, and when the luminous color of a number of micro-LED grains 11 comprised in the first micro-display optical engine 341 is single-base color, the luminous color of a number of micro-LED grains 11 comprised in the second micro-display optical engine 342 is dual-base color, and the two-base color of the second micro-display optical engine 342, excluding the color emitted by the first micro-display optical engine 341; the two micro-display optical engines 341, 342 are set at an angle a. Wherein the angle a≤14°.

As mentioned above, the dual-engine approach can improve the output brightness of the projector and reduce the difficulty of manufacturing micro-LED panels, such as splash screen, mosaic, bright and dark lines, uneven bright color and other defects can be mitigated to a certain extent, with a certain degree of cost performance.

However, it is not possible to realize practical projection of the image with the layout shown in FIG. 4, the necessary electronic trapezoid correction (the driver circuit needs to change the addressing starting and ending positions of each row of grains) is still required, to enable both micro-display optical engines 341 and 342 to project rectangular, same-sized images, and to realize perfect overlap between the output images of the two micro-display optical engines 341 and 342 through the necessary adjustment of the mechanical position, to produce full-color images The angle a is a value based on the actual application scenario, depending on the projection ratio of the micro-display optical engine, for example, the angle a needs to be >14° for the output images of the two micro-display optical engines 341 and 342 to overlap, it is already difficult to design and produce the depth of field index of the projection lens, etc., and thus is basically not practical.

Embodiment 4

Figure 5:
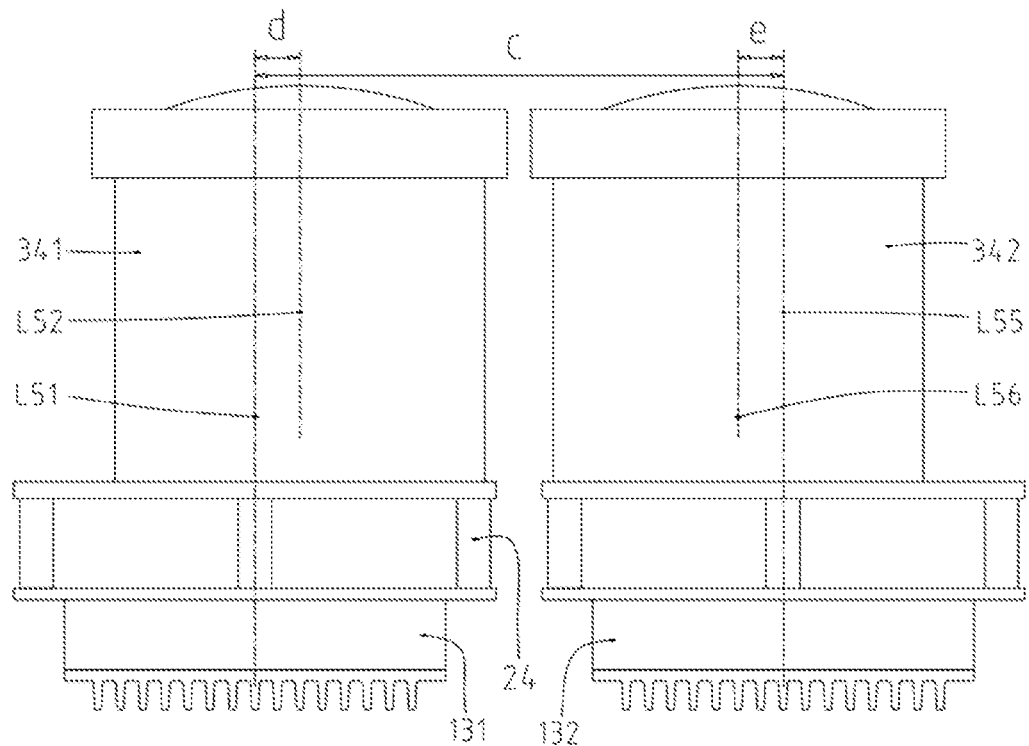
FIG. 5 is a schematic diagram of two micro-display optical engines set side by side of the present disclosure.

Referring to FIG. 5, the difference between embodiment 4 and embodiment 3 is that: the two micro-display optical engines 341, 342 are set side by side (i.e. parallel) and the two micro-display optical engines 341, 342 are set off-axis from each other; the off-axis distance of the first micro-display optical engine 341 towards the second micro-display optical engine 342 is d, and the off-axis distance of the second micro-display optical engine 342 towards the first micro-display optical engine 341 is e; let the optical axis of the first micro-LED panel 131 comprised in the first micro-display optical engine 341 be L51, the optical axis of the second micro-LED panel 132 comprised in the second micro-display optical engine 342 be L55, the distance between the optical axis L51 and the optical axis L55 be c, and the projection magnification of the two micro-display optical engines 341, 342 be β, then c=β(d+e).

The projection lens of the first micro-display optical engine 341 is coaxial with the liquid lens (L52), and the projection lens of the second micro-display optical engine 342 is coaxial with the liquid lens (L56), and a straight line segment (the length is c) is assumed to be A (straight line segment A is not drawn on the figure) between the center of the micro-LED panel 131 comprised in the first micro-display optical engine 341 (on L51) and the micro-LED panel 132 comprised in the second micro-display optical engine 342 (on L55). The off axis of the projector, that is, the offset, the projection lens and liquid lens of the first micro-display optical engine 341 only need to move along the straight line segment A as a whole, or the projection lens and liquid lens of the second micro-display optical engine 342 move along the straight line segment A as a whole until the output images of the two micro-display optical engines 341 and 342 overlap.

No electronic trapezoid correction is required when the two optical engines in the present embodiment perform image overlap, so the image is not compressed and thus can maintain the best clarity. Compared with embodiment 3, installation and commissioning will also be much simpler, which can improve the user's usability.

Embodiment 5

Figure 6:
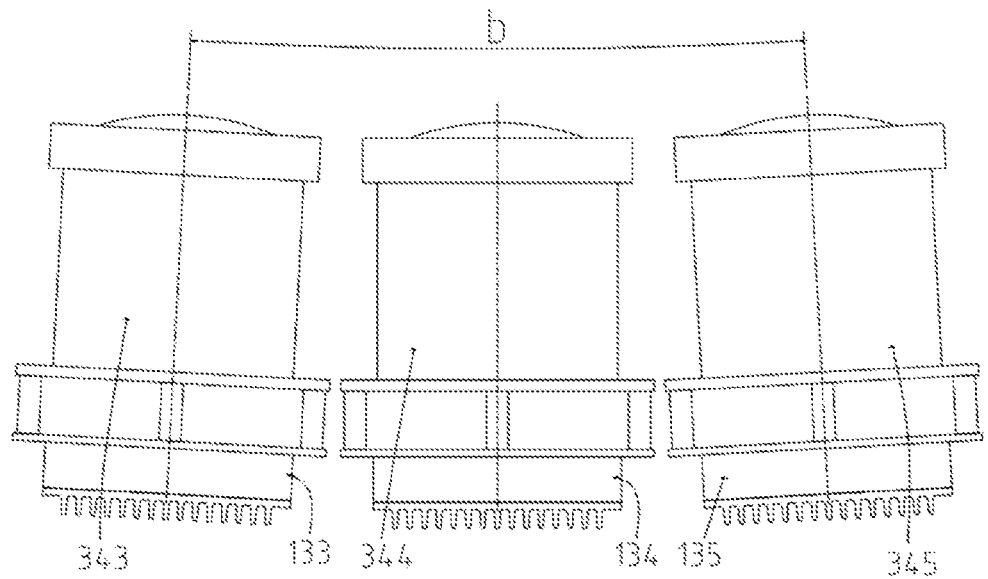
FIG. 6 is a schematic diagram of three micro-display optical engines set at angle b of the present disclosure.

Referring to FIG. 6, this embodiment provides a three-engine full-color projector, which comprises the micro-display optical engine described in embodiment 1, the number of the micro-display optical engines is three, and the luminous color of a number of micro-LED grains 11 comprised in each micro-display optical engine is one of three-base color.

The first micro-display optical engine 343 and the middle micro-display optical engine 344 are set at angle b/2, and the third micro-display optical engine 345 and the middle micro-display optical engine 344 are set at angle b/2, wherein the angle b≤28°.

Obviously, this embodiment and embodiment 3 have similarity, but this embodiment can output higher brightness, and can reduce the production difficulty of micro-LED panel at the same time, with better cost performance. And the deficiencies such as splash screen, mosaic, bright and dark lines against the single-base color of micro-display optical engine have essential improvement.

In general, the three-engine approach is generally (but not limited to) a green micro-display optical engine as the middle one, with red and blue micro-display optical engines on both side.

Embodiment 6

Figure 7:
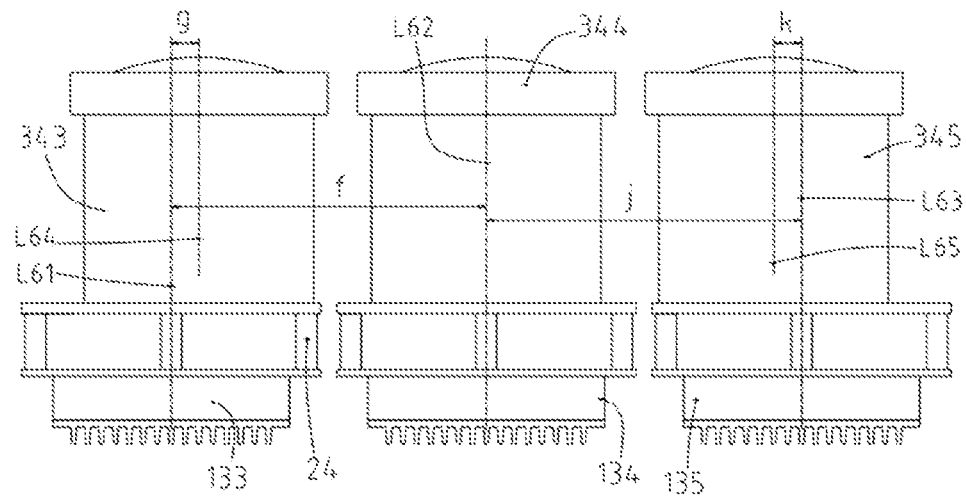
FIG. 7 is a schematic diagram of three micro-display optical engines set side by side of the present disclosure.

Referring to FIG. 7, this embodiment provides a three-engine full-color projector, which comprises the micro-display optical engine described in embodiment 1, the number of the micro-display optical engines is three, and the luminous color of a number of micro-LED grains 11 comprised in each micro-display optical engine is one of three-base color.

Three micro-display optical engines 343, 344, 345 are set side by side, wherein the two micro-display optical engines 343, 345 distributed on both sides: the off-axis distance of the first micro-display optical engine 343 toward the middle micro-display optical engine 344 is g, and the off-axis distance of the third micro-display optical engine 345 toward the middle micro-display optical engine 344 is k; let the optical axis of the first micro-LED panel 133 comprised in the first micro-display optical engine 343 be L61, the optical axis of the second micro-LED panel 134 comprised in the middle micro-display optical engine 344 be L62, the distance between the optical axis L61 and optical axis L62 be f, and the projection magnification of the two micro-display optical engines 343, 344 be β, then f=βg; similarly, let the optical axis of the third micro-LED panel 135 comprised in the third micro-display optical engine 345 be L63, the distance between the optical axis L63 and optical axis L62 be j, and the projection magnification of the two micro-display optical engines 345, 344 be β, then j=βk.

Obviously, this embodiment and embodiment 4 have similarity, but this embodiment can output higher brightness, and can reduce the production difficulty of micro-LED panel at the same time, with better cost performance and practicality.

The foregoing has shown and described the basic principle, main features and advantage of the present disclosure. It should be understood by the technician in the art that the present disclosure is not limited by the above-mentioned embodiments, the above-mentioned embodiments and description only illustrate the principle of the present disclosure, the disclosure will have various variations and improvements without departing from the spirit and scope of the disclosure, such variations and improvements all fall within the scope of the claimed disclosure. The claimed scope of the present disclosure is defined by the appended claims and the equivalents.

What is claimed is:

1. A micro-display optical engine, wherein comprising a micro-LED panel, a coolant (21), a thin lens (22), a metal frame (23), a connecting pillar (24) and a projection lens;

the micro-LED panel comprises a substrate (1), a number of pixel light-emitting micro-LED grains (11), a glass plate (12), a metal bracket (13), a sealing frame (14), a radiator (15), a filling adhesive (16) and a transparent heat-conducting adhesive (17);

the sealing frame (14) is in the shape of a square tube, the sectional length and width dimensions of the sealing frame (14) are equal to the length and width dimensions of the glass plate (12); the incident surfaces of the substrate (1), sealing frame (14) and glass plate (12) are sequentially fitted; located among the substrate (1), sealing frame (14) and glass plate (12), a number of the micro-LED grains (11), and a driver circuit for addressing a number of the micro-LED grains (11) one by one, are set on the substrate (1); the electrodes of a number of the micro-LED grains (11) are bonded to the driver circuit set on the substrate (1); the electrodes of a number of the micro-LED grains (11) are inverted structures;

the length of the sealing frame (14) is 6 μm-10 μm greater than the height value of the top surface of a number of the micro-LED grains (11) above the surface of the substrate (1);

the luminous color of a number of the micro-LED grains (11) is single, dual or three-base color;

the metal frame (23) is in the shape of a tube, and one end of the metal frame (23) is fitted to the outgoing surface of the glass plate (12), the other end is connected to the thin lens (22) to form a closed cavity; the closed cavity is filled with the coolant (21); the glass plate (12), the coolant (21) and the thin lens (22) form a liquid lens;

the metal bracket (13) covers outside the substrate (1), sealing frame (14), glass plate (12) and one end of the metal frame (23), and the substrate (1) is fitted to be installed on the inner surface of the metal bracket (13); the filling adhesive (16) is filled among the metal frame (23), the glass plate (12) and the metal bracket (13); the radiator (15) is fitted to be installed on the back of the metal bracket (13);

the outgoing surface of the glass plate (12) is made into a first black matrix (121) in the area outside the light-emitting angle θ selected by a number of the micro-LED grains (11);

the incident surface of the glass plate (12) is made into a second black matrix (122) in the area outside the light-emitting angle θ selected by a number of the micro-LED grains (11);

the incident surface of the glass plate (12) is made with the transparent heat-conducting adhesive (17) in the area opposite to a number of the micro-LED grains (11), the top surface of a number of the micro-LED grains (11), the transparent heat-conducting adhesive (17) and the incident surface of the glass plate (12) are sequentially fitted; the thickness of the transparent heat-conducting adhesive (17) is 10 µm;

the projection lens comprises an outer lens barrel (34), and an incident lens set (31), an intermediate lens set (32) and an outgoing lens set (33) installed inside the outer lens barrel (34) and set successively according to the direction of light traveling; the incident lens set (31), the intermediate lens set (32) and the outgoing lens set (33) all contain at least one lens; the metal bracket (13) is connected to the outer lens barrel (34) by the connecting pillars (24); the number of the connecting pillars (24) is at least greater than or equal to three;

an Fno of combination lens of the liquid lens and the projection lens is ≤1.2.

2. The micro-display optical engine according to claim 1, wherein the material of the glass plate (12) is an optical crystal.

3. The micro-display optical engine according to claim 1, wherein the incident lens set (31) contains a first lens (311) and a second lens (312) set successively according to the direction of light traveling; the number of lenses of the intermediate lens set (32) is one; the outgoing lens set (33) contains a fourth lens (331) and a fifth lens (332) set successively according to the direction of light traveling.

4. The micro-display optical engine according to claim 1, wherein the thin lens (22) is concave-convex type, and the convex surface is opposite to the glass plate (12); the convex and concave surfaces of the thin lens (22) are one of free-form, aspheric or spherical or a combination of any two;

the thickness of the thin lens (22) is equal or unequal from the center to the edge;

the light-passing surface of the concave surface of the thin lens (22) has a shape: when a number of the micro-LED grains 11 emit light at an angle, which is greater than that the Fno value limits on the angle of light, greater than that the light limited the angle by the value of the Fno is fully reflected on the concave surface.

5. The micro-display optical engine according to claim 1, wherein the absolute value of the difference between the refractive index of the coolant (21) and the thin lens (22) ≤0.2; the absolute value of the difference between the refractive index of the coolant (21) and the glass plate (12) ≤0.3.

6. The micro-display optical engine according to claim 1, wherein the filling adhesive (16) is silicone rubber.

7. The micro-display optical engine according to claim 1, wherein the transparent heat-conducting adhesive (17) is optical grade silicone.

* * * * *